US012660572B2

(12) United States Patent
Saito

(10) Patent No.: US 12,660,572 B2
(45) Date of Patent: Jun. 16, 2026

(54) SUBSTRATE PROCESSING APPARATUS AND SUBSTRATE PROCESSING METHOD

(71) Applicant: Tokyo Electron Limited, Tokyo (JP)

(72) Inventor: Susumu Saito, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 1008 days.

(21) Appl. No.: 17/756,372

(22) PCT Filed: Nov. 12, 2020

(86) PCT No.: PCT/JP2020/042230
§ 371 (c)(1),
(2) Date: May 24, 2022

(87) PCT Pub. No.: WO2021/106597
PCT Pub. Date: Jun. 3, 2021

(65) Prior Publication Data
US 2023/0005798 A1 Jan. 5, 2023

(30) Foreign Application Priority Data
Nov. 26, 2019 (JP) ................................. 2019-213094

(51) Int. Cl.
*H10P 74/00* (2026.01)
*G01J 5/00* (2022.01)
*H10P 72/00* (2026.01)
*H10P 95/90* (2026.01)

(52) U.S. Cl.
CPC .............. *H10P 74/238* (2026.01); *G01J 5/00* (2013.01); *H10P 72/0436* (2026.01); *H10P 95/90* (2026.01)

(58) Field of Classification Search
CPC . H01L 21/67115; H01L 21/324; H01L 22/26; G01J 5/00
USPC ....................................................... 219/446.1
See application file for complete search history.

(56) References Cited

U.S. PATENT DOCUMENTS

| | | | | |
|---|---|---|---|---|
| 6,034,357 | A | * 3/2000 | Guardado | ......... H01L 21/67248 219/390 |
| 6,222,990 | B1 | * 4/2001 | Guardado | ............... C30B 25/10 219/390 |
| 6,393,210 | B1 | * 5/2002 | Wu | .................... H01L 21/67115 219/390 |
| 6,479,801 | B1 | * 11/2002 | Shigeoka | .............. G01J 5/0003 392/416 |
| 6,563,092 | B1 | * 5/2003 | Shrinivasan | ...... H01L 21/67248 392/416 |

(Continued)

FOREIGN PATENT DOCUMENTS

| | | |
|---|---|---|
| CN | 101802574 A | 8/2010 |
| JP | 2886101 B2 | 4/1999 |

(Continued)

*Primary Examiner* — Jimmy Chou
(74) *Attorney, Agent, or Firm* — Armstrong Teasdale LLP

(57) ABSTRACT

The present disclosure is a substrate processing apparatus including: a chamber configured to accommodate a substrate; a heat source configured to heat-treat the substrate; a heat ray sensor provided outside the chamber and configured to receive infrared rays radiated from the substrate; and an infrared ray transmission window provided in the chamber and configured to transmit an infrared ray having a wavelength greater than or equal to 8 μm to the heat ray sensor.

9 Claims, 6 Drawing Sheets

(56)  References Cited

U.S. PATENT DOCUMENTS

| | | | |
|---|---|---|---|
| 6,818,864 B2 | 11/2004 | Ptak | |
| 7,015,422 B2 * | 3/2006 | Timans | F27B 17/0025 |
| | | | 118/724 |
| 8,420,981 B2 | 4/2013 | Goodman et al. | |
| 8,891,948 B2 * | 11/2014 | Kusuda | H01L 21/67248 |
| | | | 392/416 |
| 9,025,943 B2 * | 5/2015 | Kuroiwa | G01J 5/026 |
| | | | 392/416 |
| 9,793,145 B2 | 10/2017 | Ranish | |
| 2001/0002668 A1 * | 6/2001 | Gat | H01L 21/67115 |
| | | | 219/390 |
| 2004/0018008 A1 * | 1/2004 | Koren | C30B 25/105 |
| | | | 392/416 |
| 2006/0086713 A1 * | 4/2006 | Hunter | F27B 17/0025 |
| | | | 219/411 |
| 2008/0223825 A1 | 9/2008 | Onishi | |
| 2010/0133255 A1 * | 6/2010 | Bahng | H01L 21/67115 |
| | | | 219/526 |
| 2013/0010460 A1 | 1/2013 | Peil et al. | |
| 2013/0193132 A1 | 8/2013 | Serebryanov et al. | |
| 2014/0154369 A1 * | 6/2014 | Kolls | A23L 2/54 |
| | | | 426/115 |
| 2015/0069046 A1 * | 3/2015 | Tsai | H01L 21/67115 |
| | | | 392/416 |
| 2015/0072533 A1 | 3/2015 | Muraki et al. | |
| 2015/0075748 A1 | 3/2015 | Suzuki et al. | |
| 2015/0181649 A1 * | 6/2015 | Ji | H05B 3/0047 |
| | | | 219/502 |
| 2017/0200618 A1 | 7/2017 | Hada et al. | |
| 2018/0061683 A1 | 3/2018 | Parkhe | |
| 2018/0077754 A1 * | 3/2018 | Ito | G01J 5/602 |
| 2018/0254208 A1 | 9/2018 | Chang et al. | |
| 2018/0254224 A1 * | 9/2018 | Kitazawa | H01L 22/12 |
| 2023/0005798 A1 | 1/2023 | Saito | |

FOREIGN PATENT DOCUMENTS

| | | | |
|---|---|---|---|
| JP | 2000-036468 A | 2/2000 | |
| JP | 2003-286093 A | 10/2003 | |
| JP | 5352103 A | 11/2013 | |
| JP | 2015-056519 A | 3/2015 | |
| JP | 2017-126734 A | 7/2017 | |
| JP | 2017-130518 A | 7/2017 | |
| KR | 10-2019-0009701 A | 1/2019 | |

* cited by examiner

FIG. 1

Temperature of wafer calculated using calibration equation [°C]

Temperature of wafer measured using thermocouple [°C]

Temperature
Quartz window/Thermopile

———27°C/29°C

------28°C/52°C

— — —41°C/52°C

—··—41°C/71°C

—·—·66°C/71°C

151a、151b(150a、150b)

Z9   Z10

Z5   Z6

Z1   Z2

Z14   Z11

Z4   Z3

Z8   Z7

Z13   Z12

SUBSTRATE PROCESSING APPARATUS AND SUBSTRATE PROCESSING METHOD

CROSS-REFERENCE TO RELATED APPLICATIONS

The present application is a U.S. National Stage Entry of International Patent Application No. PCT/JP2020/042230, filed Nov. 12, 2020, which claims the benefit of priority to Japanese Patent Application No. 2019-213094, filed Nov. 26, 2019, each of which is hereby incorporated herein by reference in its entirety.

TECHNICAL FIELD

The present disclosure relates to a substrate processing apparatus and a substrate processing method.

BACKGROUND

Patent Document 1 discloses a processing system including a COR process apparatus that performs a COR process on a substrate and a PHT process apparatus that performs a PHT process on a substrate. The PHT process apparatus includes a stage on which two substrates are placed in a horizontal state, and the stage is provided with a heater. The substrates subjected to the COR process are heated by this heater to perform a PHT process of vaporizing (sublimating) a reaction product produced by the COR process.

PRIOR ART DOCUMENTS

Patent Documents

Patent Document 1: Japanese Patent No. 5352103

The technique according to the present disclosure appropriately measures the temperature of a substrate, which is accommodated in a chamber, from the outside of the chamber in a non-contact manner.

SUMMARY

According to an embodiment of the present disclosure, a substrate processing apparatus includes: a chamber configured to accommodate a substrate; a heat source configured to heat-treat the substrate; a heat ray sensor provided outside the chamber and configured to receive infrared rays radiated from the substrate; and an infrared ray transmission window provided in the chamber and configured to transmit an infrared ray having a wavelength greater than or equal to 8 μm to the heat ray sensor.

According to the present disclosure, it is possible to appropriately measure the temperature of a substrate, which is accommodated in a chamber, from the outside of the chamber in a non-contact manner.

BRIEF DESCRIPTION OF DRAWINGS

FIG. 1 is a plan view schematically illustrating a configuration of a wafer processing apparatus.

DETAILED DESCRIPTION

Figure 2:
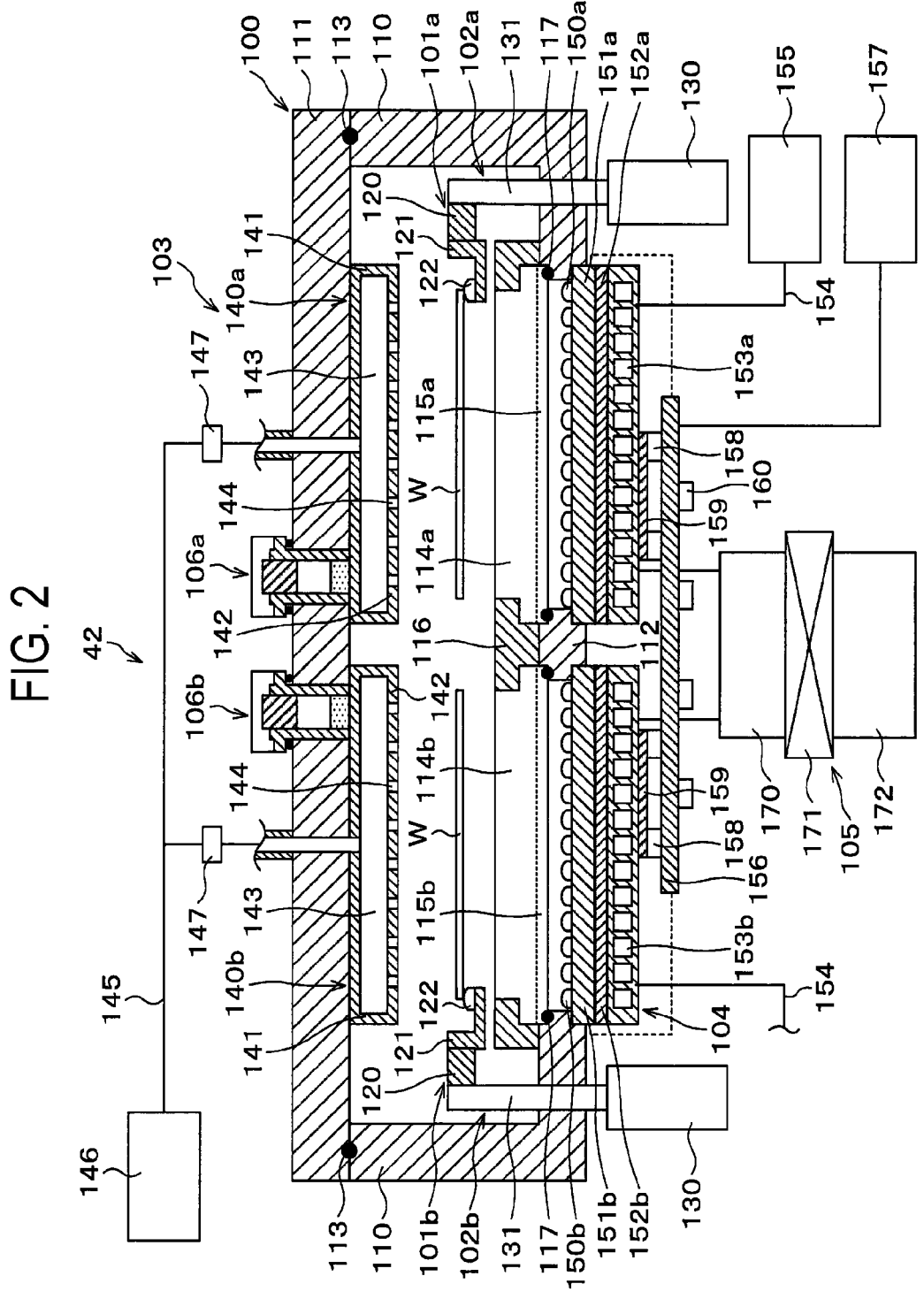
FIG. 2 is a vertical cross-sectional view schematically illustrating a configuration of a PHT module.

In a semiconductor device manufacturing process, a step of etching and removing an oxide film formed on a front surface of a semiconductor wafer (hereinafter, also referred to as a "wafer") is performed. For example, as disclosed in Patent Document 1, a step of etching the oxide film is performed by a chemical oxide removal (COR) process and a post heat treatment (PHT) process.

The COR process is a process of causing an oxide film formed on a wafer to react with a processing gas to modify the oxide film, thus generating a reaction product. The PHT process is a heating process of heating and vaporizing a reaction product produced in the COR process. By continuously performing the COR process and the PHT process, etching of the oxide film formed on the wafer is performed.

In the PHT process, a temperature of the wafer is measured to appropriately heat the wafer. At this time, a temperature of the stage heated by the heater is measured, and the temperature of the stage is estimated to be the temperature of the wafer.

Here, the wafer heating temperature in the PHT process is, for example, about 300 degrees C. In the PHT process apparatus described in Patent Document 1 in the related art, a wafer is heated by the heater embedded in the stage, and heating rate is, for example, about 0.45 degrees C./sec. Therefore, the wafer heating process takes time.

Therefore, the present inventor came up with an idea of using an LED light source having a high heating rate as a heat source to shorten the heating time. Specifically, a wafer is heated by being irradiated with the LED light emitted from the LED light source, and the heating rate is, for example, 12 degrees C./sec. Therefore, it is possible to shorten the time required for heat treatment.

However, since the PHT process is performed in a pressure-reduced atmosphere inside the chamber that accommodates the wafer, it is necessary to provide the LED light source outside the chamber. In such a case, even in a case where the temperature of the LED light source which is a heat source is measured as in the related art, it is not impossible to estimate the temperature of the LED light source as the temperature of the wafer. In the related art, the temperature measurement of a wafer in the case where the LED light source is provided outside the chamber in this way is not assumed in the first place. Therefore, there is room for improvement in the temperature measurement of a wafer in the related art.

The technique according to the present disclosure appropriately measures a temperature of a substrate, which is accommodated in a chamber, from the outside of the chamber in a non-contact manner. Hereinafter, the wafer processing apparatus and the wafer processing method according to the present embodiment will be described with reference to the drawings. In the specification and drawings, elements having substantially the same functional configurations will be denoted by the same reference numerals and redundant descriptions will be omitted.

<Wafer Processing Apparatus>

Figure 1:
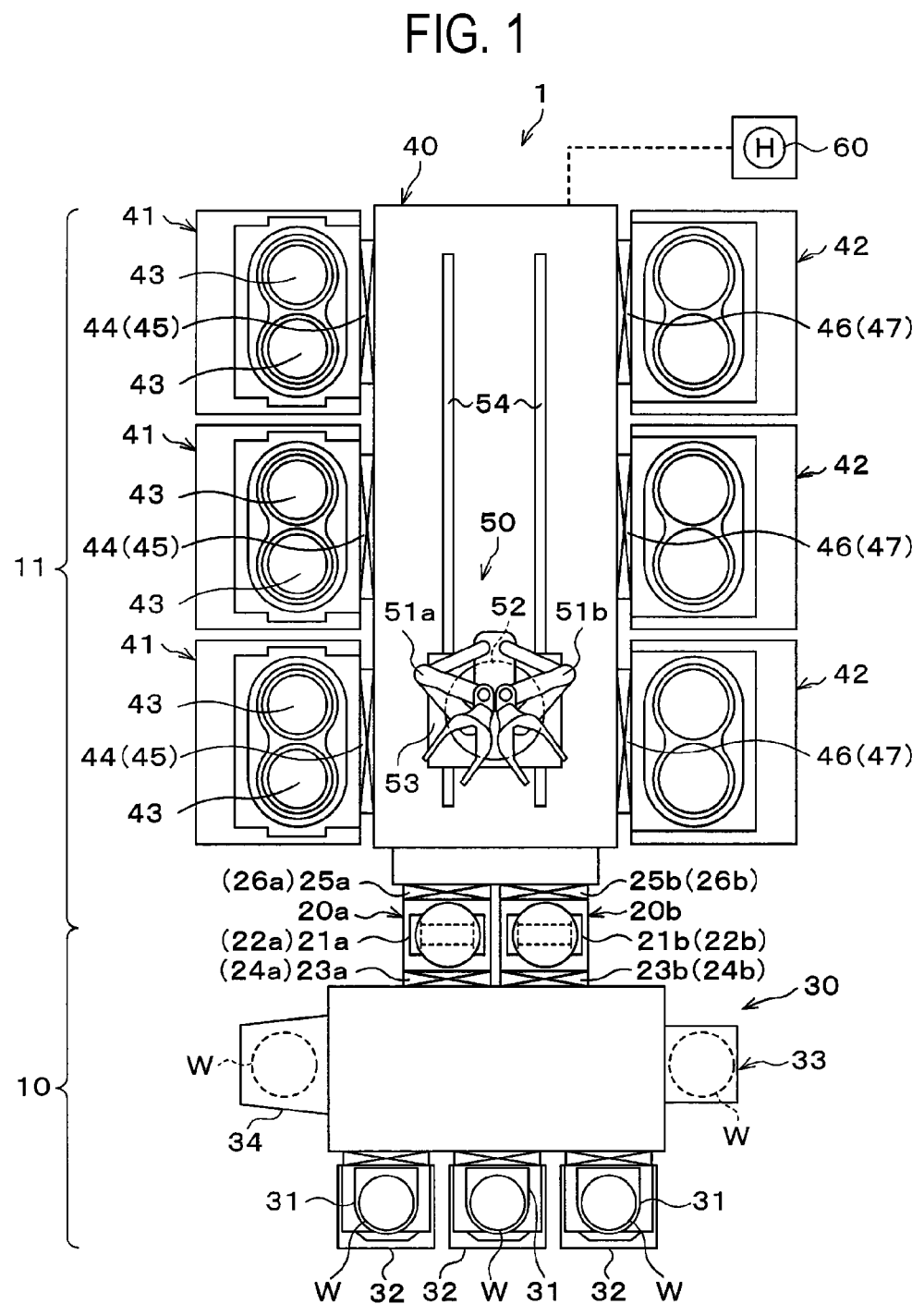

First, a configuration of a wafer processing apparatus according to the present embodiment will be described. FIG. 1 is a plan view schematically illustrating the configuration of a wafer processing apparatus 1 according to the present embodiment. In the present embodiment, the case in which the wafer processing apparatus 1 includes various processing modules configured to perform a COR process, a PHT process, a cooling storage (CST) process, and an orienting process on a wafer W as a silicon substrate will be described as an example. The module configuration of the wafer processing apparatus 1 of the present disclosure is not limited thereto and may be arbitrarily selected.

As illustrated in FIG. 1, the wafer processing apparatus 1 includes a configuration in which an atmospheric part 10 and a pressure-reduced part 11 are integrally connected to each other via load-lock modules 20a and 20b. The atmospheric part 10 includes a plurality of atmospheric modules configured to perform desired processes on wafers W under an atmospheric pressure atmosphere. The pressure-reduced part 11 includes a plurality of pressure-reduced modules configured to perform desired processes on wafers W under a pressure-reduced atmosphere.

The load-lock module 20a temporarily holds a wafer W transported from the loader module 30, which will be described later, in the atmospheric part 10 in order to deliver the wafer W to a transfer module 40, which will be described later, in the pressure-reduced part 11. The load-lock module 20a includes an upper stocker 21a and a lower stocker 22a that hold two wafers W in the vertical direction.

The load-lock module 20a is connected to the loader module 30, which will be described later, through a gate 24a provided with a gate valve 23a. The load-lock module 20a is connected to the transfer module 40, which will be described later, through a gate 26a provided with a gate valve 25a.

A gas supply part (not illustrated) configured to supply a gas and an exhaust part (not illustrated) configured to discharge the gas are connected to the load-lock module 20a, and the interior of the load-lock module 20a is configured to be switchable between an atmospheric pressure atmosphere and a pressure-reduced atmosphere by the gas supply part and the exhaust part. That is, the load-lock module 20a is configured such that the wafer W can be appropriately delivered between the atmospheric part 10 having the atmospheric pressure atmosphere and the pressure-reduced part 11 having the pressure-reduced atmosphere.

The load-lock module 20b has the same configuration as the load-lock module 20a. That is, the load-lock module 20b includes an upper stocker 21b, a lower stocker 22b, a gate valve 23b and a gate 24b on the side of the loader module 30, and a gate valve 25b and a gate 26b on the side of the transfer module 40.

The number and arrangement of load-lock modules 20a and 20b are not limited to those of the present embodiment, and may be arbitrarily set.

The atmospheric part 10 includes a loader module 30 including a wafer transport mechanism (not illustrated), a load port 32 in which a FOUP 31 capable of storing a plurality of wafers W is placed, a CST module 33 configured to cool the wafer W, and an orienter module 34 configured to adjust a horizontal orientation of the wafer W.

The loader module 30 includes a housing having a rectangular interior, and the interior of the housing is maintained in an atmospheric pressure atmosphere. A plurality of (e.g., three) load ports 32 are arranged side by side on one side surface forming a long side of the housing of the loader module 30. The load-lock modules 20a and 20b are arranged side by side on the other side surface forming a long side of the housing of the loader module 30. The CST module 33 is provided on one side surface forming a short side of the housing of the loader module 30. The orienter module 34 is provided on the other side surface forming a short side of the housing of the loader module 30. In addition, the loader module 30 includes a wafer transport mechanism (not illustrated), which is movable in a longitudinal direction of the housing inside the housing. The wafer transport mechanism is capable of transporting wafers W between the FOUPs 31 placed in the load ports 32 and the load-lock modules 20a and 20b. The configuration of the wafer transport mechanism is the same as that of the wafer transport mechanism 50, which will be described later.

The number and arrangement of load ports 32, CST modules 33, and orienter modules 34 are not limited to those in the present embodiment, and may be arbitrarily designed.

The FOUP 31 accommodates a plurality of, for example, 25 wafers of one lot, such that the wafers W are stacked in multiple stages at equal intervals. In addition, the interior of the FOUP 31 placed in the load port 32 is filled with, for example, air or nitrogen gas, and is sealed.

The CST module 33 is capable of accommodating a plurality of wafers W (the number of which is, for example, equal to or greater than the number of wafers W accommodated in the FOUP 31) in multiple stages at equal intervals, and performs a cooling process on the plurality of wafers W.

The orienter module 34 rotates a wafer W to adjust the orientation of the same in the horizontal direction. Specifically, the orienter module 34 is adjusted such that the orientation from a reference position (e.g., a notch position) in the horizontal direction is the same for each wafer process when the wafer process is performed on each of a plurality of wafers W.

The pressure-reduced part 11 includes a transfer module 40 configured to simultaneously transport two wafers W, a COR module 41 configured to perform a COR process on the wafers W transported from the transfer module 40, and a PHT module 42 configured to perform a PHT process on the wafers W. The interior of each of the transfer module 40, the COR module 41, and PHT module 42 is maintained in a pressure-reduced atmosphere. For the transfer module 40, a plurality of (e.g., three) COR modules 41 and a plurality of (e.g., three) PHT modules 42 are provided.

The transfer module 40 includes a housing having a rectangular interior and is connected to the load-lock modules 20a and 20b through the gate valves 25a and 25b, as described above. The transfer module 40 sequentially transports the wafers W carried into the load-lock module 20a to one COR module 41 and one PHT module 42 to be subjected to the COR process and the PHT process, and then carries out the wafers W to the atmospheric part 10 via the load-lock module 20b.

Inside the COR module 41, two stages 43 on which two wafers W are placed side by side in the horizontal direction are provided. The COR module 41 simultaneously performs the COR process on the two wafers W by placing the wafers W side by side on the stages 43. In addition, the COR module 41 is connected to a gas supply part (not illustrated)

configured to supply a processing gas, a purge gas, or the like, and an exhaust part (not illustrated) configured to discharge the gas.

The COR module 41 is connected to the transfer module 40 through a gate 45 provided with a gate valve 44. With this gate valve 44, airtightness is secured between the transfer module 40 and the COR module 41 and communication between the transfer module 40 and the COR module 41 is achieved in a compatible manner.

Inside the PHT module 42, two buffers 101*a* and 101*b*, which will be described later, on which two wafers W are placed side by side in the horizontal direction are provided. The PHT module 42 simultaneously performs the PHT process on two wafers W by placing the wafers W side by side on the buffers 101*a* and 101*b*. The configuration of the PHT module 42 will be specified later.

The PHT module 42 is connected to the transfer module 40 through a gate 47 provided with a gate valve 46. With this gate valve 46, airtightness is secured between the transfer module 40 and the PHT module 42 and communication between the transfer module 40 and the PHT module 42 is achieved in a compatible manner.

Inside the transfer module 40, a wafer transport mechanism 50 configured to transport wafers W is provided. The wafer transport mechanism 50 includes transport arms 51*a* and 51*b* configured to hold and move two wafers W, a rotary table 52 configured to rotatably support the transport arms 51*a* and 51*b*, and a rotary stage 53 on which the rotary table 52 is mounted. In addition, inside the transfer module 40, guide rails 54, which extend in the longitudinal direction of the transfer module 40, are provided. The rotary stage 53 is provided on the guide rails 54, and the wafer transport mechanism 50 is configured to be movable along the guide rails 54.

In the transfer module 40, two wafers W held by the upper stocker 21*a* and the lower stocker 22*a* in the load-lock module 20*a* are received by the transport arm 51*a* and transported to a COR module 41. Two wafers W subjected to the COR process are held by the transport arm 51*a* and transported to the PHT module 42. In addition, two wafers W subjected to the PHT process are held by the transport arm 51*b*, and are carried out to the load-lock module 20*b*.

The wafer processing apparatus 1 described above is provided with a controller 60. The controller 60 is a computer including, for example, a CPU, a memory, and the like, and includes a program storage part (not illustrated). The program storage stores a program that controls the processing of the wafer W in the wafer processing apparatus 1. The program storage part also stores programs that controls operations of a drive system of various processing modules, transport mechanisms, and the like described above to implement a wafer process to be described later in the wafer processing apparatus 1. The programs may be those recorded in a computer-readable storage medium H or may be those installed in the controller 60 from the storage medium H.

<Operation of Wafer Processing Apparatus>

The wafer processing apparatus 1 according to the present embodiment is configured as described above. Next, a wafer process in the wafer processing apparatus 1 will be described.

First, a FOUP 31 accommodating a plurality of wafers W is placed in a load port 32.

Next, two wafers W are taken out from the FOUP 31 by the wafer transport mechanism and transported to the orienter module 34. In the orienter module 34, the orientation of the wafers W in the horizontal direction from a reference position (e.g., a notch position) is adjusted (an orienting process).

Next, the two wafers W are carried into the load-lock module 20*a* by the wafer transport mechanism. When the two wafers W are carried into the load-lock module 20*a*, the gate valve 23*a* is closed, and the interior of the load-lock module 20*a* is sealed and pressure-reduced. Thereafter, the gate valve 25*a* is opened, and the interior of the load-lock module 20*a* and the interior of the transfer module 40 communicate with each other.

Next, when the load-lock module 20*a* and the transfer module 40 communicate with each other, the two wafers W are held by the transport arm 51*a* of the wafer transport mechanism 50, and are carried into the transfer module 40 from the load-lock module 20*a*. Subsequently, the wafer transport mechanism 50 moves to the front of one COR module 41.

Next, the gate valve 44 is opened, and the transport arm 51*a* holding the two wafers W enters the COR module 41. Then, one wafer W is placed on each of the stages 43 from the transport arm 51*a*. Thereafter, the transport arm 51*a* exits from the COR module 41.

Next, when the transport arm 51*a* exits from the COR module 41, the gate valve 44 is closed, and the COR module 41 performs a COR process on the two wafers W. In the COR process, a processing gas is supplied to the surface of an oxide film, such that the oxide film and the processing gas are chemically reacted with each other and the oxide film is modified to produce a reaction product. For example, hydrogen fluoride gas and ammonia gas are used as the processing gas, and ammonium fluorosilicate (AFS) is produced as a reaction product.

Next, when the COR process in the COR module 41 is terminated, the gate valve 44 is opened, and the transport arm 51*a* enters the COR module 41. Then, the two wafers W are delivered from the stages 43 to the transport arm 51*a*, and the two wafers W are held by the transport arm 51*a*. Thereafter, the transport arm 51*a* exits from the COR module 41, and the gate valve 44 is closed.

Next, the wafer transport mechanism 50 moves to the front of a PHT module 42. Next, the gate valve 46 is opened, and the transport arm 51*a* holding the two wafers W enters the PHT module 42. Then, one wafer W is placed on each of the buffers 101*a* and 101*b* from the transport arm 51*a*. Thereafter, the transport arm 51*a* exits from the PHT module 42. Subsequently, the gate valve 46 is closed, and the PHT process is performed on the two wafers W. The specific processes of this PHT process will be described later.

Next, when the PHT process on the wafers W is terminated, the gate valve 46 is opened, and the transport arm 51*b* enters the PHT module 42. Then, the two wafers W are delivered from the buffers 101*a* and 101*b* to the transport arm 51*b*, and the two wafers W are held by the transport arm 51*b*. Thereafter, the transport arm 51*b* exits from the PHT module 42, and the gate valve 46 is closed.

Thereafter, the gate valve 25*b* is opened, and the two wafers W are carried into the load-lock module 20*b* by the wafer transport mechanism 50. When the wafers W are carried into the load-lock module 20*b*, the gate valve 25*b* is closed, and the interior of the load-lock module 20*b* is sealed and opened to the atmosphere.

Next, the two wafers W are transported to the CST module 33 by the wafer transport mechanism. In the CST module 33, the wafers W are subjected to a CST process, and the wafers W are cooled.

Next, the two wafers W are returned to and accommodated in the FOUP 31 by the wafer transport mechanism. In this way, a series of wafer processes in the wafer processing apparatus 1 are completed.

<PHT Module>

Next, the configuration of the PHT module 42 as a substrate processing apparatus will be described. FIG. 2 is a vertical sectional view schematically illustrating the configuration of the PHT module 42. In the PHT module 42 of the present embodiment, a process is performed on two wafers W.

The PHT module 42 includes an airtightly configured chamber 100, two buffers 101*a* and 101*b* configured to hold wafers W inside the chamber 100, two lifting mechanisms 102*a* and 102*b* configured to raise or lower the buffers 101*a* and 101*b*, respectively, a gas supply part 103 configured to supply a gas into the chamber 100, a heating part 104 configured to heat the wafers W held on the buffers 101*a* and 101*b*, an exhaust part 105 configured to discharge the gas inside the chamber 100, and temperature measurement parts (or temperature detectors) 106*a* and 106*b* configured to measure the temperatures of the wafers W held by the buffers 101*a* and 101*b*.

The chamber 100 is, for example, a substantially rectangular parallelepiped container as a whole, which is made of a metal such as aluminum or stainless steel. The chamber 100 has, for example, a substantially rectangular shape in a plan view, and includes a cylindrical side wall 110 having open top and bottom surfaces, a ceiling plate 111 that hermetically covers the top surface of the side wall 110, and a bottom plate 112 that covers the bottom surface of the side wall 110. A sealing member 113 that hermetically maintains the interior of the chamber 100 is provided between the upper end surface of the side wall 110 and the ceiling plate 111. Each of the side wall 110, the ceiling plate 111, and the bottom plate 112 is provided with a heater (not illustrated), and the side wall 110, the ceiling plate 111, and the bottom plate 112 are heated to, for example, 100 degrees C. or higher by the heaters to suppress adhesion of deposits such as sublimated AFS.

The bottom plate 112 is partially opened, and quartz windows 114*a* and 114*b* as LED transmission windows are fitted in the opening portions. The quartz windows 114*a* and 114*b* are provided between the buffers 101*a* and 101*b* and LED light sources 150*a* and 150*b*, which will be described later, and are configured to transmit the LED light from the LED light sources 150*a* and 150*b*. The material of the quartz windows 114*a* and 114*b* is not particularly limited as long as it transmits LED light, but, for example, quartz is used. As will be described later, the LED light sources 150*a* and 150*b* are provided to correspond to the two buffers 101*a* and 101*b*, and the two quartz windows 114*a* and 114*b* are provided to correspond to the two LED light sources 150*a* and 150*b*.

On the bottom surfaces of the quartz windows 114*a* and 114*b*, for example, heating plates 115*a* and 115*b* in which heaters (not illustrated) are built, respectively, are provided. The heating plates 115*a* and 115*b* are configured to transmit the LED light from the LED light sources 150*a* and 150*b*. The material of the heating plates 115*a* and 115*b* is not particularly limited as long as it transmits LED light, but for example, a heater in which a heating wire and a conductive substance are attached to transparent quartz is used. By heating the quartz windows 114*a* and 114*b* to, for example, 100 degrees C. or higher with the heating plates 115*a* and 115*b*, it is possible to suppress adhesion of deposits to the quartz windows 114*a* and 114*b* and to suppress fogging of the quartz windows 114*a* and 114*b*.

The quartz windows 114*a* and 114*b* is provided with a thermocouple (not illustrated), and the temperatures of the quartz windows 114*a* and 114*b* are measured by the thermocouple.

The quartz windows 114*a* and 114*b* are supported by a support member 116 provided on the top surface of the bottom plate 112. Sealing members 117 that maintain the interior of the chamber 100 hermetically are provided between the bottom plate 112 and the quartz windows 114*a* and 114*b* (the heating plates 115*a* and 115*b*).

Two buffers 101*a* and 101*b* are provided inside the chamber 100, and each of the buffers 101*a* and 101*b* holds a wafer W. The buffers 101*a* and 101*b* each include an arm member 120 configured in a substantially C shape in a plan view. The arm member 120 is curved along a peripheral edge of the wafer W with a curvature radius greater than a diameter of the wafer W. The arm member 120 is provided with holding members 121 protruding inward from the arm member 120 and holding an outer peripheral portion of a rear surface of the wafer W at a plurality of locations, for example, three locations. Each holding member 121 is configured to transmit the LED light from the LED light sources 150*a* and 150*b*. The material of the holding member 121 is not particularly limited as long as it transmits LED light, but, for example, quartz is used. As described in Patent Document 1 in the related art, when a wafer W is placed on a stage made of, for example, aluminum, an aluminum component may be transferred to the rear surface of the wafer W, such that metal contamination may occur on the rear surface of the wafer W. In this respect, in the present embodiment, since the outer peripheral portion of the rear surface of the wafer W is held, metal contamination can be suppressed.

A support pin 122 configured to support the wafer W is provided on each of the three holding members 121. The support pins 122 are configured to transmit the LED light from the LED light sources 150*a* and 150*b*. The material of the support pins 122 is not particularly limited as long as it transmits LED light, but, for example, quartz is used.

Two lifting mechanisms 102*a* and 102*b* are provided, and the lifting mechanism 102*a* and 102*b* raises and lowers the buffers 101*a* and 101*b*, respectively. The lifting mechanisms 102*a* and 102*b* respectively include buffer drive part 130 provided outside the chamber 100, and drive shafts 131 configured to support the arm members 120 of the buffers 101*a* and 101*b* and connected to the buffer drive parts 130 such that the drive shafts 131 penetrate the bottom plate 112 of the chamber 100 and extend inside the chamber 100 vertically upward. For the buffer drive parts 130, for example, actuators driven by a motor driver (not illustrated) are used. The lifting mechanisms 102*a* and 102*b* may dispose the buffers 101*a* and 101*b* at any height positions by raising or lowering the drive shafts 131 by the buffer drive parts 130, respectively. As a result, as will be described later, a position where a heating process is performed on the wafer W and a position where a cooling process is performed on the wafer W may be appropriately regulated.

The gas supply part 103 supplies gas (a cooling gas and a purge gas) into the chamber 100. The gas supply part 103 includes shower heads 140*a* and 140*b* that distribute and supply gas into the chamber 100. The shower heads 140*a* and 140*b* are provided on the bottom surface of the ceiling plate 111 of the chamber 100 to correspond to the buffers 101*a* and 101*b*. For example, each of the shower heads 140*a* and 140*b* includes a substantially cylindrical frame body 141 having an open bottom surface and supported on the bottom surface of the ceiling plate 111, and a substantially diskshaped shower plate 142 fitted to the inner surface of the frame body 141. The shower plate 142 is provided at a predetermined distance from the ceiling portion of the frame body 141. As a result, a space 143 is formed between the ceiling portion of the frame body 141 and the top surface of the shower plate 142. The shower plate 142 is provided with a plurality of openings 144 penetrating the same in the thickness direction.

A gas source 146 is connected to the space 143 between the ceiling portion of the frame body 141 and the shower plate 142 via a gas supply pipe 145. The gas source 146 is configured to be capable of supplying, for example, N$_2$ gas, Ar gas, or the like, as a cooling gas or a purge gas. Therefore, the gas supplied from the gas source 146 is supplied toward the wafers W held on the buffers 101a and 101b via the space 143 and the shower plates 142. In addition, the gas supply pipe 145 is provided with flow rate adjustment mechanisms 147 configured to adjust the supply amount of gas, such that the amount of the gas to be supplied to each wafer W may be controlled individually.

The heating parts 104 heat the wafers W held on the buffers 101a and 101b. The heating part 104 includes two LED light sources 150a and 150b which serve as heat sources and are provided outside the chamber 100, and LED mounting boards 151a and 151b having front surfaces on which the LED light sources 150a and 150b are mounted respectively. The LED mounting boards 151a and 151b are provided to be fitted to the lower portion of the bottom plate 112 of the chamber 100, and the LED light sources 150a and 150b are disposed below the quartz windows 114a and 114b. That is, the LED light sources 150a and 150b are provided to correspond to the buffers 101a and 101b, the shower heads 140a and 140b, and the quartz windows 114a and 114b, respectively. The LED light emitted from the LED light sources 150a and 150b passes through the quartz windows 114a and 114b and is irradiated to the wafers W held on the buffers 101a and 101b. The LED light heats the wafers W to a desired temperature.

The LED light has such a wavelength that the LED light penetrates the quartz windows 114a and 114b made of quartz and is absorbed by the wafers W containing silicon. Specifically, the wavelength of the LED light is, for example, 400 nm to 1,100 nm, more preferably 800 nm to 1,100 nm, and 855 nm in the present embodiment.

On the rear surfaces of the LED mounting boards 151a and 151b, cooling plates 153a and 153b configured to cool the LED light sources 150a and 150b via heat transfer sheets 152a and 152b are provided. Since a minute gap is formed between the LED mounting boards 151a and 151b and the cooling plates 153a and 153b, the heat transfer sheets 152a and 152b are provided to improve heat transfer. As a cooling medium, for example, cooling water flows inside the cooling plates 153a and 153b. A cooling water source 155 configured to be capable of supplying the cooling water is connected to the cooling plates 153a and 153b via cooling water supply pipes 154, respectively.

Below the cooling plates 153a and 153b, an LED control board 156 that controls the LED light sources 150a and 150b is provided. The LED control board 156 is commonly provided for the two LED light sources 150a and 150b. An LED power supply 157 is connected to the LED control board 156. Components 158 that require cooling, such as FETs and diodes, are mounted on the front surface of the LED control board 156. These components 158 are provided at the cooling plates 153a and 153b via heat transfer pads 159. That is, the cooling plates 153a and 153b cool not only the above-described LED light sources 150a and 150b, but also the components 158. In addition, components 160 that do not require cooling in the LED control board 156 are provided on the rear surface of the LED control board 156.

The exhaust part 105 includes an exhaust pipe 170 that discharges the gas inside the chamber 100. The exhaust pipe 170 is disposed outside the quartz windows 114a and 114b in the bottom plate 112. Since the quartz windows 114a and 114b, the LED light sources 150a and 150b, or the like are provided below the wafers W, the exhaust pipe 170 is disposed at a position offset from the quartz windows 114a and 114b, the LED light sources 150a and 150b, or the like. A pump 172 is connected to the exhaust pipe 170 via a valve 171. For the valve 171, for example, an automatic pressure control valve (an APC valve) is used. For the pump 172, for example, a turbo molecular pump (TMP) is used. When the pump 172 is used, the gas inside the chamber 100 can be forcibly discharged with a great pressure.

For example, radiation thermometers are used as the temperature measurement parts 106a and 106b, and the temperature measurement parts 106a and 106b measure the temperatures of the wafers W held by the buffers 101a and 101b, respectively. The temperature measurement parts 106a and 106b are provided through the ceiling plate 111 of the chamber 100. The configuration of the temperature measurement parts 106a and 106b and a method of measuring the temperature of the wafer W will be described below.

<Operation of PHT Module>

Figure 3A:
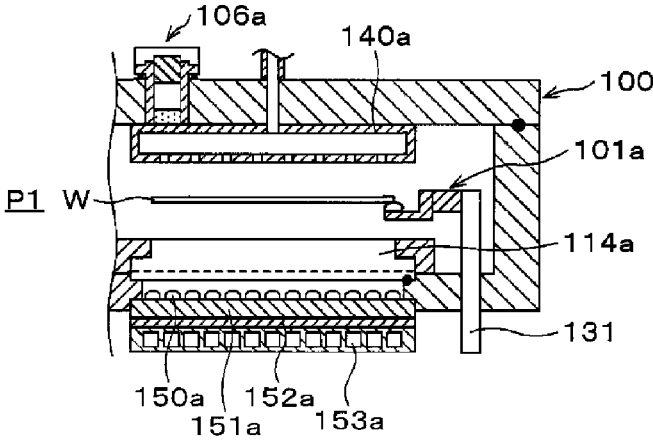
FIGS. 3A to 3C are explanatory views illustrating a state in which a PHT process is performed in a PHT module.
Figure 3B:
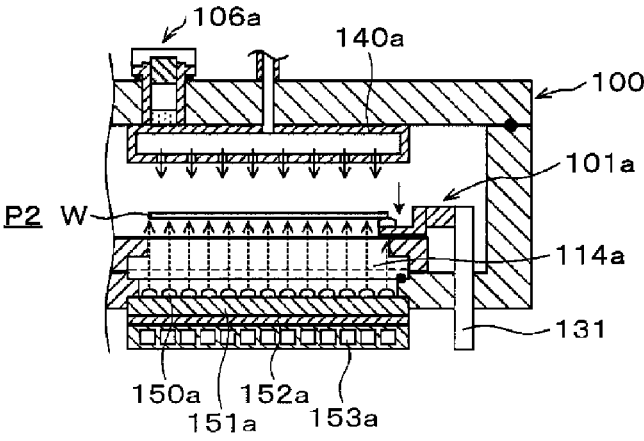
Figure 3C:
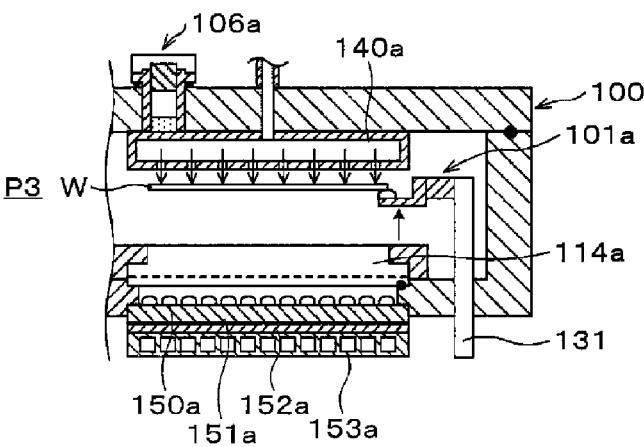

The PHT module 42 according to the present embodiment is configured as described above. Next, a PHT process (a heating/cooling process) in the PHT module 42 will be described. FIGS. 3A to 3C are explanatory views illustrating a state in which a PHT process is performed in the PHT module 42. Although FIGS. 3A to 3C illustrate a half of the chamber 100 (e.g., the buffer 101a, the temperature measurement part 106a, the quartz window 114a, the shower head 140a, the LED light source 150a, and the like), that is, one wafer W, actually two wafers W are processed at the same time.

First, the gate valve 46 is opened, and, as illustrated in FIG. 3A, a wafer W is carried into the PHT module 42 at a transport position P1 and delivered from the transport arm 51a of the wafer transport mechanism 50 to the buffer 101a. Thereafter, the gate valve 46 is closed.

Next, as illustrated in FIG. 3B, the buffer 101a is lowered to dispose the wafer W at a heating position P2. The heating position P2 is a position as close to the LED light source 150a as possible. For example, a distance between the wafer W and the LED light source 150a is 200 mm or less. Thereafter, the temperature of the wafer W is measured by the temperature measurement part 106a. As a result, a reference temperature of the wafer W is confirmed.

Next, the LED light source 150a is turned on. The LED light emitted from the LED light source 150a passes through the quartz window 114a, and is radiated to the wafer W. As a result, the wafer W is heated to a desired heating temperature, for example, 300 degrees C. (heating process step). This heating temperature of 300 degrees C. is a temperature equal to or higher than the sublimation temperature of AFS on the wafer W, as will be described later. The heating rate is, for example, 12 degrees C./sec. Then, the heating rate of the present embodiment is faster than the heating rate (0.45 degrees C./sec) by the heater used in the related art, and therefore it is possible to efficiently heat the wafer W in a short time and to improve a throughput of the wafer process. In addition, the LED light source 150a controls pulses of the LED light such that the temperature is within a predetermined range. PMW control in which a cycle of a switch frequency is, for example, 1 kHz to 500 kHz is performed.

At this time, $N_2$ gas as a purge gas is supplied from the shower head 140a of the gas supply part 103. Then, the pressure inside the chamber 100 is regulated to, for example, 0.1 Torr to 10 Torr. Since the $N_2$ gas from the shower head 140a is uniformly supplied from a plurality of openings 144, the gas flow inside the chamber 100 may be rectified.

At this time, the temperature of the wafer W is measured by the temperature measurement part 106a, and the LED light source 150a is feedback-controlled. Specifically, based on the temperature measurement result, the LED light emitted from the LED light source 150a is controlled such that the wafer W has a desired heating temperature.

Then, the temperature of the wafer W is maintained at 300 degrees C., and after a desired time elapses, the AFS on the wafer W is heated and vaporized (sublimated). Thereafter, the LED light source 150a is turned off. An end point detection method at this time is arbitrary, but may be monitored with, for example, a gas analyzer (e.g., OES, QMS, FT-IR, or the like), a film thickness meter, or the like.

Next, as illustrated in FIG. 3C, the buffer 101a is raised and the wafer W is disposed at a cooling position P3. The cooling position P3 is a position as close to the shower head 140a as possible, and for example, a distance between the wafer W and the shower head 140a is 200 mm or less.

Subsequently, $N_2$ gas as a cooling gas is supplied from the shower head 140a, and the wafer W is cooled to a desired cooling temperature, for example, 180 degrees C. (cooling process step). The cooling temperature of 180 degrees C. is a temperature at which the transport arm 51b of the wafer transport mechanism 50 is capable of holding the wafer W. The cooling rate is, for example, 11 degrees C./sec. Then, the cooling rate of the present embodiment is faster than a cooling rate of natural cooling (0.5 degrees C./sec) in the related art, and therefore it is possible to efficiently cool the wafer W in a short time and to further improve the throughput of the wafer process. Since the $N_2$ gas from the shower head 140a is uniformly supplied from the plurality of openings 144, it is possible to uniformly cool the wafer W.

From the heating process step to the cooling process step, the supply of $N_2$ gas from the shower head 140a is continued. However, a supply amount of $N_2$ gas in the cooling process step is, for example, 40 L/min, which is greater than a supply amount of $N_2$ gas in the heating process step. However, the supply amount of $N_2$ gas depends on a volume of the chamber 100. In addition, the pressure inside the chamber 100 in the cooling process step is 1 Torr to 100 Torr, which is higher than the pressure inside the chamber 100 in the heating process step.

Thereafter, when the wafer W reaches the desired cooling temperature, the supply amount of $N_2$ gas in the cooling process step is restored. The end point detection method at this time is arbitrary, but may be controlled during, for example, the cooling time, or the temperature of the wafer W may be measured by the temperature measurement part 106a.

Next, the buffer 101a is lowered, and the wafer W is disposed again at the transport position P1 as illustrated in FIG. 3A. Thereafter, the gate valve 46 is opened, and the wafer W is delivered from the buffer 101a to the transport arm 51b of the wafer transport mechanism 50. Then, the wafer W is carried out from the PHT module 42.

In the PHT process (heating/cooling process) in the PHT module 42, the interior of the chamber 100 is evacuated by the exhaust part 105. At this time, in a normal operation, the gas is exhausted by $N_2$ gas from the shower head 140a.

However, the pump 172 may be operated to perform high-speed exhaust to shorten the exhaust time.

<Temperature Measurement Part>

Figure 4:
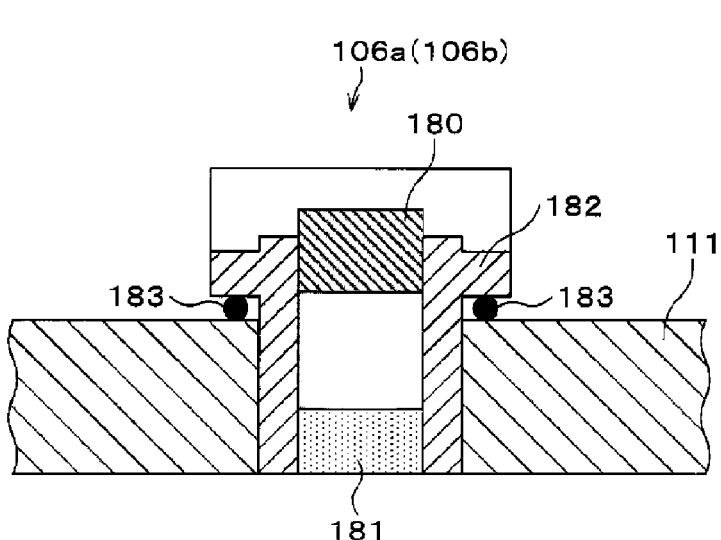
FIG. 4 is a vertical cross-sectional view schematically illustrating a configuration of a temperature measurement part.

Next, configurations of the temperature measurement parts 106a and 106b will be described. FIG. 4 is a vertical cross-sectional view schematically illustrating the configurations of the temperature measurement parts 106a and 106b.

The temperature measurement parts 106a and 106b include a thermopile 180 as a heat ray sensor, a diamond window 181 as an infrared ray transmission window, and an optical diaphragm 182 interconnecting the thermopile 180 and the diamond window 181. The thermopile 180 is provided at a base end portion of the optical diaphragm 182 outside the chamber 100. The diamond window 181 is provided at the tip end of the optical diaphragm 182 in the ceiling plate 111, and seals the interior of the chamber 100. In addition, a seal member 183 that hermetically maintains the interior of the chamber 100 is provided between the optical diaphragm 182 and the outer surface of the chamber 100.

The thermopile 180 is accommodated in, for example, a metal package and includes a plurality of thermocouples (not illustrated). The thermopile 180 converts thermal energy (radiation energy) into electric energy, and specifically, the thermopile 180 receives infrared rays radiated from the wafer W and outputs an electric signal based on a light reception result. In addition, the thermopile 180 includes a thermistor (a temperature sensor), and the temperature of the thermopile 180 is measured by the thermistor.

Here, in the PHT module 42 of the present embodiment, the wafer W is heated to a desired heating temperature, for example, 300 degrees C., as will be described later. Therefore, the temperature of the wafer W measured by the temperature measurement part 106a or 106b is at room temperature or higher and 300 degrees C. or lower.

Figure 5:
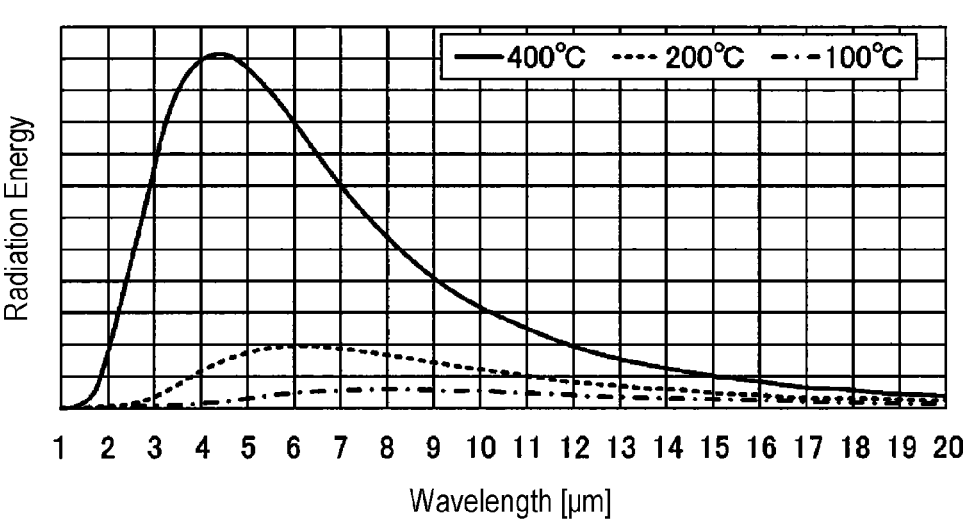
FIG. 5 is a graph showing a relationship between a wavelength of light and radiation energy.

FIG. 5 is a graph showing a relationship between a wavelength of light (the horizontal axis) and radiation energy (the vertical axis). Generally, when a temperature of a target object is high, change in radiation energy is great and a high resolution is obtained, but when the temperature of the target object is low, change in radiation energy is small and the resolution is low.

Figure 6:
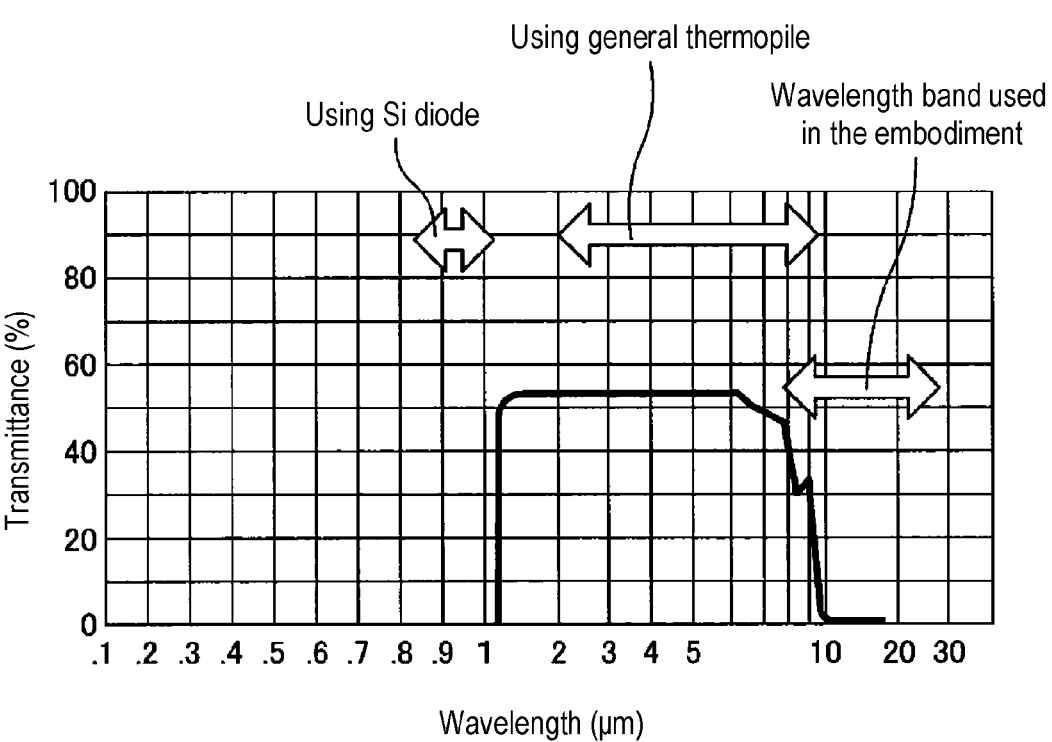
FIG. 6 is a graph showing a relationship between a wavelength of light and a transmittance of silicon.

FIG. 6 is a graph showing a relationship between a wavelength of light (a horizontal axis) and a transmittance of silicon (a vertical axis). In many cases, a radiation thermometer, which uses a general thermopile, measures light having a wavelength of, for example, 2 μm to 10 μm. This thermopile has great radiation energy and is highly sensitive, but since silicon transmits light in the above-mentioned wavelength band, a temperature of silicon may not be measured. Meanwhile, a radiation thermometer using a photodiode and configured to measure the temperature of silicon may measure, for example, light having a wavelength of 1.1 μm or less. This photodiode may measure a wavelength at which the light does not penetrate silicon, but because the photodiode has a low radiation energy, it is impossible to measure a low temperature, for example, a temperature 300 degrees C. or lower.

From the above, the thermopile 180 of the present embodiment measures light of 8 μm or more. In such a case, since the transmittance of silicon decreases, it is possible to measure the temperature of the wafer W made of the silicon.

Here, a general thermopile is provided with a filter window configured to protect a plurality of thermocouples. The filter window contains, for example, silicon or germanium. In addition, the filter window is provided with a film configured to transmit infrared rays in a desired wavelength band, that is, the filter window limits the wavelength of infrared rays to be transmitted. In contrast, in the thermopile 180 of the present embodiment, the filter window is removed such that infrared rays of various wavelength bands may be received. Then, the thermopile 180 may measure light of 8 μm or more as described above.

In the present embodiment, the thermopile 180 (electro-motive force type) is used as the heat ray sensor, but the present disclosure is not limited thereto. For example, as the heat ray sensor, a bolometer (resistance type) or a pyroelec-tric element (charge type) may be used.

The diamond window 181 transmits infrared rays having a wavelength of, for example, 8 μm or more and 100 μm or less. As described above, since the thermopile 180 of the present embodiment measures infrared rays of 8 μm or more, the diamond window 181 transmits infrared rays of such wavelengths. In addition, the diamond window 181 is pro-vided with a thermocouple (not illustrated), and the tem-perature of the diamond window 181 is measured by the thermocouple.

The diamond window 181 may be provided with a film that transmits infrared rays having a wavelength of 8 μm or more, and the diamond window 181 may be used as a band pass filter.

In the present embodiment, diamond is used as the material of the infrared transmission window, but the present disclosure is not limited thereto. As the infrared transmission window, any material that is capable of transmitting infrared rays having a wavelength of 8 μm or more may be used. For example, potassium bromide (KBr), which is capable of transmitting infrared rays having a wavelength of up to 20 and barium fluoride (BaF$_2$), which is capable of transmitting infrared rays having a wavelength up to 14 may be used as the infrared ray transmission window.

The optical diaphragm 182 has, for example, a tubular shape. The optical diaphragm 182 serves to suppress entry of light in various directions, narrow a field of view, and prevent the measurement of temperatures other than that of the wafer W. An infrared ray transmission lens (not illus-trated) may be used instead of the optical diaphragm 182.

The temperature measurement parts 106a and 106b according to the present embodiment are configured as described above. Next, a method of measuring the tempera-ture of the wafer W by using the temperature measurement part 106a or 106b will be described.

When a wafer W is carried into the chamber 100 and a process is performed on the wafer W, the infrared rays radiated from the wafer W penetrate the diamond window 181 and are received by the thermopile 180. At this time, the infrared rays radiated from the wafer W have a wavelength of 8 μm or more, and the diamond window 181 is capable of appropriately transmitting the infrared rays having the wavelength. When receiving the infrared rays, the thermo-pile 180 outputs an electric signal based on the light recep-tion result.

At this time, the temperatures of the thermopile 180 is measured by the thermistor of the thermopile 180. Similarly, the temperature of the diamond window 181 is measured by the thermocouple provided in the diamond window 181 and the temperature of the quartz window 114a or 114b are measured by the thermocouple provided in the quartz win-dow 114a or 114b.

Then, the temperature measurement part 106a or 106b remove an influence of the temperature which becomes noise from the output from the thermopile 180, and calcu-lates the temperature of the wafer W. Specifically, in the present embodiment, the temperature of the wafer W is calculated by using the following Equation 1. In Equation 1, the output of the thermopile 180 is a voltage, and unit of other temperatures is degrees C.

$$[\text{Temperature of wafer } W] = \text{coefficient } A \times [\text{output from thermopile 180}] + \text{coefficient } B \times [\text{temperature of thermopile 180}] + \text{coefficient } C \times [\text{temperature of diamond window 181}] + \text{coefficient } D \times [\text{temperatures of quartz windows 114a and 114b}] + \text{intercept.} \qquad [\text{Equation 1}]$$

When measuring the temperature of the wafer W, the temperature of the thermopile 180 may become noise. Therefore, in Equation 1 described above, the influence of the temperature of the thermopile 180 is canceled.

When processing the wafer W, the chamber 100 itself is also heated. The temperature of the diamond window 181 provided in the chamber 100 may also become noise. Therefore, in Equation 1 described above, the influence of the temperature of the diamond window 181 is canceled.

The quartz windows 114a and 114b transmit light with a wavelength of up to 2 μm and do not transmit light with a wavelength of 2 μm or more. The quartz windows 114a and 114b are heated to a desired temperature by the heating plates 115a and 115b. When the light with the wavelength of 2 μm or more is radiated from the quartz windows 114a and 114b by thermal energy, the light enters the thermopile 180. Then, the temperatures of the quartz window 114a and 114b may also become noise. Therefore, in Equation 1 described above, the influence of the temperatures of the quartz window 114a and 114b are canceled.

When the thermopile 180, the diamond window 181, and the optical diaphragm 182 are thermally coupled, it is assumed that these parts have the same temperature. In such a case, the influence of the temperature of the diamond window 181 may be replaced by the influence of the temperature of the thermopile 180. Therefore, the tempera-ture of the wafer W is calculated by using the following Equation 2, which does not include a term of the influence of the temperature of the diamond window 181 in Equation 1 described above.

$$[\text{Temperature of wafer } W] = \text{coefficient } A \times [\text{output from thermopile 180}] + \text{coefficient } B \times [\text{temperature of thermopile 180}] + \text{coefficient } C \times [\text{temperatures of quartz windows 114a and 114b}] + \text{intercept.} \qquad [\text{Equation 2}]$$

In addition, a quadratic term (square term) may be added on the right side of Equation 1 or 2, or Equation 1 or 2 may be logarithmically converted to improve linearity of Equa-tion 1 or 2.

When an infrared ray transmission lens is used instead of the optical diaphragm 182, the term [temperature of ther-mopile 180] is introduced into the term [output from ther-mopile 180] in Equations 1 and 2, the item [temperature of thermopile 180] is omitted.

Equation 1 or 2 described above is derived in advance before processing the wafer W in the PHT module 42. Next, a method of deriving this equation will be described. Here-inafter, the method of deriving Equation 2 will be described, but the method of deriving Equation 1 is also the same.

First, while raising the temperature of the wafer W, the quartz window 114a and the thermopile 180 are controlled to independent temperatures for measurement. A thermo-couple is provided on the wafer W to measure the tempera-ture of the wafer. This wafer W is a wafer for temperature measurement to derive Equation 2. However, a thermo-couple may be provided on one of wafers W to be a product to confirm an accuracy of Equation 2.

Figure 7:
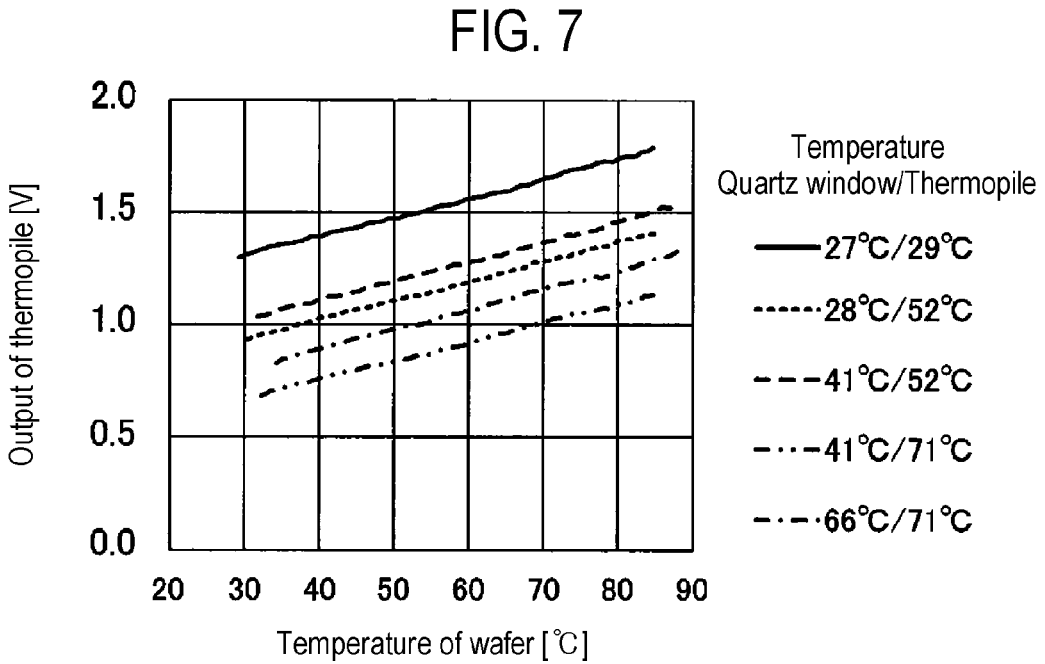
FIG. 7 is a graph showing a relationship between a temperature of a wafer and an output of a thermopile for each temperature of a quartz window and a thermopile.

FIG. 7 is a graph showing a relationship between a temperature of a wafer W (horizontal axis) and an output of a thermopile 180 (vertical axis) for each temperature of the quartz window 114a and the thermopile 180. Specifically, the wafer W was heated from room temperature to about 90 degrees C. The temperature of the quartz window 114a was changed to 27 degrees C., 28 degrees C., 41 degrees C., and 66 degrees C., and the temperature of the thermopile 180 was changed to 29 degrees C., 52 degrees C., and 71 degrees C. The temperature of the quartz window 114a and the temperature of the thermopile 180 are in the temperature range that can be obtained by the PHT module 42.

Figures 8, 9:
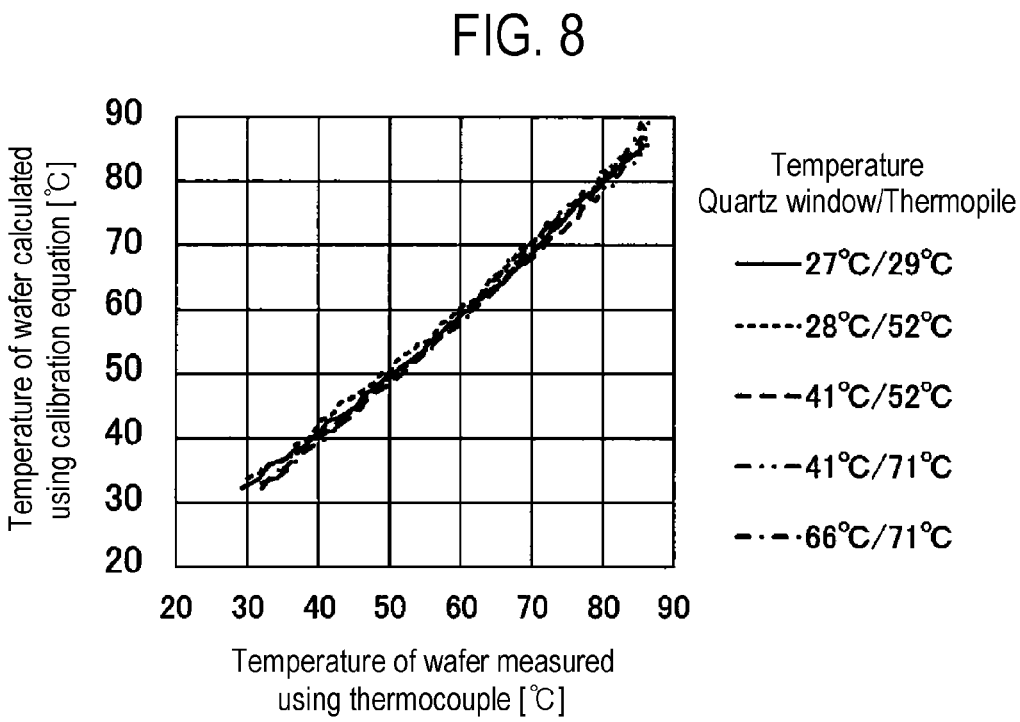
FIG. 8 is a graph showing a relationship between a temperature of a wafer measured by a thermocouple and a temperature of the wafer calculated by a multiple regression equation (a calibration equation).
FIG. 9 is a plan view schematically illustrating a configuration of an LED light source.

Next, a multiple regression analysis was performed by using the output of the thermopile 180, the temperature of the thermopile 180, and the temperature of the quartz window 114a illustrated in FIG. 7, and each coefficient and intercept in Equation 2 were calculated. Specifically, as shown in FIG. 8, Equation 2 was derived such that the temperature of the wafer W measured by the thermocouple (horizontal axis) and the temperature of the wafer W calculated by a multiple regression equation (calibration equation), i.e., Equation 2 (vertical axis) match with each other. In this example, each coefficient and intercept in Equation 2 were derived as represented in the following Equation 2':

[Temperature of wafer $W$]=148.5×[output from thermopile 180]+2.1×[temperature of thermopile 180]−1.1×[temperatures of quartz windows 114a and 114b]−194.2.  [Equation 2']

When operating the LED light sources 150a and 150b, the temperatures of the LED light sources 150a and 150b may also become noise. However, since it is difficult to measure the temperatures of the LED light sources 150a and 150b, Equation 2 is derived in the state in which operation of the LED light sources 150a and 150b is stopped. However, when the temperatures of the LED light sources 150a and 150b can be measured, the temperature of the wafer W may be calculated by using the following Equation 3:

[Temperature of wafer $W$]=coefficient $A$×[output from thermopile 180]+coefficient $B$×[temperature of thermopile 180]+coefficient $C$×[temperature of diamond window 181]+coefficient $D$×[temperatures of quartz windows 114a and 114b]+coefficient $E$×[temperatures of LED light sources 150a and 150b]+intercept.  [Equation 3]

According to the above-described embodiments, by using the temperature measurement parts 106a and 106b, which are radiation thermometers and further using Equation 1 or 2, the influence of the temperature which becomes noise may be canceled and the temperature of the wafer W in a temperature range of room temperature or higher and 300 degrees C. or lower may be measured in a non-contact manner. Therefore, it is possible to appropriately measure the temperature of the wafer W even under a pressure-reduced atmosphere (a vacuum atmosphere) such as that of the PHT module 42. In addition, based on the temperature measurement result of the wafer W, it is possible to feedback-control the LED light sources 150a and 150b and to appropriately adjust the heating temperature of the wafer W.

A desired film may be formed in advance on a wafer W to be processed by the PHT module 42. Emissivity of the wafer W on which such a film is formed is different from that of a bare wafer made of silicon. In such a case, the radiation amount of the wafer W immediately after being carried into the PHT module 42 may be measured to obtain an emissivity correction coefficient, which may be reflected in Equation 1 or 2 described above. Specifically, for example, assuming that the wafer W carried out from the FOUP 31 has the same temperature as the environmental temperature, a temperature measurement part similar to the temperature measurement parts 106a and 106b illustrated in FIG. 4 is installed on the transfer module 40. The emissivity correction coefficient may be calculated from a difference between the temperature measured by this temperature measurement part and the environmental temperature. It is desirable that a measurement location on the wafer W at this time is the same location as a measurement location in the PHT module 42.

OTHER EMBODIMENTS

In the PHT module 42 of the above-described embodiments, as shown in FIG. 9, the LED mounting boards 151a and 151b (LED light sources 150a and 150b) may be divided into a plurality of zones Z1 to Z14 in a plan view. The LED mounting boards 151a and 151b are radially divided into a central portion (Center), a middle portion (Middle), and an outer peripheral portion (Edge). The central portion is divided into four zones Z1 to Z4, the middle portion is divided into four zones Z5 to Z8, and the outer peripheral portion is divided into six zones Z9 to Z14. The number of the divided LED mounting boards 151a and 151b is not limited to the present embodiment and may be set arbitrarily. For example, when a temperature difference occurs in the wafer plane due to a distance between the LED light sources 150a and 150b and surrounding members, the outer peripheral portion may be divided into a number according to the temperature difference.

About 200 LED elements of LED light sources 150a and 150b are disposed in each of the zones Z1 to Z14. Since the numbers of LED elements in respective zones Z1 to Z14 are equal in this way, the voltages in respective zones Z1 to Z14 can be made equal. In the present embodiment, the voltage of one LED element is controlled to be 1.8V, and the voltage of each of the zones Z1 to Z14 is controlled to be 400V. Since the maximum potential difference of about 200 V occurs between respective zones Z1 to Z14, it is necessary to secure an insulation distance corresponding to that potential difference. The number of LED elements in each of the zones Z1 to Z14 is not limited to the present embodiment and may be arbitrarily set.

In the case in which the LED light sources 150a and 150b are divided into a plurality of zones Z1 to Z14 in this way, when the temperature of the wafer W is measured by the temperature measurement parts 106a and 106b, the temperatures of the respective zones Z1 to Z14 may be measured. Even in this case, the temperatures of respective zones Z1 to Z14 may be measured by using Equation 1 or 2. Then, based on the measurement result, the LED elements of respective zone Z1 to Z14 can be appropriately feedback-controlled.

In the PHT module 42 of the above-described embodiments, the temperatures of wafers W processed in the pressure-reduced atmosphere (vacuum atmosphere) are measured by using the LED light sources 150a and 150b, but the temperature measurement parts 106a and 106b of the present disclosure are also be applicable to the PHT module in the related art. That is, even when wafers W are placed on the stage in which heaters are embedded and the PHT process is performed, the temperatures of the wafers W can be measured by providing the temperature measurement parts 106a and 106b in the PHT module.

In such a case, since the quartz windows 114a and 114b are not provided in the PHT module, the temperatures of the wafers W are calculated by using Equation 4 below in which the term of the influence of the temperatures of the quartz windows 114a and 114b is canceled from Equation 1.

$$[\text{Temperature of wafer } W]=\text{coefficient } A\times[\text{output from thermopile 180}]+\text{coefficient } B\times[\text{temperature of thermopile 180}]+\text{coefficient } C\times[\text{temperature of diamond window 181}]+\text{intercept.} \qquad [\text{Equation 4}]$$

When the temperature of the heater (heat source) of the stage is measured, the temperature of the wafer W may be calculated by using the following Equation 5 obtained by adding a term of the influence of the temperature of the heater to Equation 4 described above.

$$[\text{Temperature of wafer } W]=\text{coefficient } A\times[\text{output from thermopile 180}]+\text{coefficient } B\times[\text{temperature of thermopile 180}]+\text{coefficient } C\times[\text{temperature of diamond window 181}]+\text{coefficient } D\times[\text{temperature of heater of stage}]+\text{intercept.} \qquad [\text{Equation 5}]$$

In the above-described embodiments, the temperature of the wafer W in the PHT module 42 is measured, but the temperature measurement parts 106a and 106b of the present disclosure are applicable to other apparatuses. For example, the temperature of wafer W processed by various apparatuses such as an etching apparatus may be measured.

The embodiments disclosed herein should be considered to be exemplary in all respects and not restrictive. The above-described embodiments may be omitted, replaced, or modified in various forms without departing from the scope and gist of the appended claims.

The following configurations also fall within the technical scope of the present disclosure.

(1) A substrate processing apparatus includes: a chamber configured to accommodate a substrate; a heat source configured to heat-treat the substrate; a heat ray sensor provided outside the chamber and configured to receive infrared rays radiated from the substrate; and an infrared ray transmission window provided in the chamber and configured to transmit an infrared ray having a wavelength greater than or equal to 8 μm to the heat ray sensor.

According to item (1) described above, the infrared rays radiated from the substrate are received by the heat ray sensor through the infrared transmission window, and an electric signal corresponding to the light reception result is output from the heat ray sensor. In addition, based on this output result, the influence of the temperature of the heat ray sensor and the temperature of the infrared transmission window, which become noises, is canceled and the temperature of the substrate is calculated. Therefore, it is possible to measure the temperature of the substrate in a desired temperature range in a non-contact manner. In addition, based on the temperature measurement result of the substrate, it is possible to feedback-control the heat source and to appropriately regulate the heat treatment temperature of the substrate.

(2) The substrate processing apparatus of item (1), wherein the heat ray sensor is a thermopile.

(3) The substrate processing apparatus of item (1) or (2) above, wherein the infrared ray transmission window is made of diamond.

(4) The substrate processing apparatus of any one of items (1) to (3) above, further including an optical diaphragm that connects the heat ray sensor and the infrared ray transmission window.

(5) The substrate processing apparatus of any one of items (1) to (4) above, wherein the heat source is an LED light source provided outside the chamber, and the substrate processing apparatus includes an LED transmission window provided in the chamber and configured to transmit LED light emitted from the LED light source.

(6) The substrate processing apparatus of item (5) above, wherein the LED transmission window is made of quartz.

According to item (5) or (6) above, the substrate is heated by using the LED light source, and the heating rate thereof is faster than that of the heater being used in the related art. Therefore, it is possible to efficiently perform a heat heating process in a short time, and as a result, it is possible to improve a throughput of the substrate process. Moreover, even in such a substrate processing apparatus, it is possible to appropriately measure the temperature of the substrate.

(7) The substrate processing apparatus of any one of items (1) to (6) above, wherein a temperature of the substrate measured by using the heat ray sensor is room temperature or higher and 300 degrees C. or lower.

According to item (7) described above, it is possible to measure the temperature of the substrate at room temperature or higher and 300 degrees C. or lower, and to measure, for example, the temperature of the substrate in the PHT process.

(8) A substrate processing method including: a) carrying a substrate into a chamber; b) heat-treating the substrate by using a heat source; c) receiving, by a heat ray sensor provided outside the chamber, infrared rays radiated from the substrate through an infrared ray transmission window provided in the chamber and transmitting an infrared ray having a wavelength of 8 μm or more; d) outputting an electric signal according to a light reception result, from the heat ray sensor; and e) calculating a temperature of the substrate based on the following Equation 1:

$$[\text{Temperature of the substrate}]=\text{coefficient } A\times[\text{output from the heat ray sensor}]+\text{coefficient } B\times[\text{temperature of the heat ray sensor}]+\text{coefficient } C\times[\text{temperature of the infrared ray transmission window}]+\text{intercept.} \qquad [\text{Equation 1}]$$

(9) The substrate processing method of item (8) above, wherein in e), the influence of a temperature of the heat source is further considered in the Equation 1, and the temperature of the substrate is calculated based on the following Equation 2:

$$[\text{Temperature of the substrate}]=\text{coefficient } A\times[\text{output from the heat ray sensor}]+\text{coefficient } B\times[\text{temperature of the heat ray sensor}]+\text{coefficient } C\times[\text{temperature of the infrared ray transmission window}]+\text{coefficient } D\times[\text{temperature of the heat source}]+\text{intercept} \qquad [\text{Equation 2}]$$

(10) The substrate processing method of item (9) above, wherein the heat ray sensor and the infrared ray transmission window are thermally coupled to each other, and wherein in e), the temperature of the substrate is calculated based on the following Equation 3, which substitutes Equation 2:

$$[\text{Temperature of the substrate}]=\text{coefficient } A\times[\text{output from the heat ray sensor}]+\text{coefficient } B\times[\text{temperature of the heat ray sensor}]+\text{coefficient } C\times[\text{temperature of the heat source}]+\text{intercept.} \qquad [\text{Equation 3}]$$

(11) The substrate processing method of any one of items (8) to (10) above, wherein the heat source is an LED light source provided outside the chamber, and wherein in b), the substrate is heated by being irradiated with LED light, which is emitted from the LED light source, through an LED transmission window provided in the chamber.

(12) The substrate processing method of item (11) above, wherein in e), an influence of a temperature of the LED transmission window is further considered in the Equation 1, and the temperature of the substrate is calculated based on the following Equation 4:

[Temperature of the substrate]=coefficient $A$×[output from the heat ray sensor]+coefficient $B$×[temperature of the heat ray sensor]+coefficient $C$×[temperature of the infrared ray transmission window]+coefficient $D$×[temperature of the LED transmission window]+intercept.　　[Equation 4]

(13) The substrate processing method of item (12) above, wherein the Equation 3 is derived in a state in which the operation of the LED light source is stopped.

(14) The substrate processing apparatus of item (12) or (13) above, wherein the heat ray sensor and the infrared ray transmission window are thermally coupled to each other, and wherein in e), the temperature of the substrate is calculated based on the following Equation 5, which substitutes Equation 4:

[Temperature of the substrate]=coefficient $A$×[output from the heat ray sensor]+coefficient $B$×[temperature of the heat ray sensor]+coefficient $C$×[temperature of the LED transmission window]+intercept　　[Equation 5]

(15) The substrate processing method of any one of items (11) to (14) above, wherein the LED light source is divided into a plurality of zones, and wherein in the e), the temperature of the substrate is measured for each of the plurality of zones.

(16) The substrate processing method of any one of items (8) to (15) above, wherein a temperature of the substrate measured by using the heat ray sensor is room temperature or higher and 300 degrees C. or lower.

EXPLANATION OF REFERENCE NUMERALS

42: PHT module, 100: chamber, 150a, 150b: LED light source, 180: thermopile, 181: diamond window, W: wafer

What is claimed is:

1. A substrate processing method comprising:

a) carrying a substrate into a chamber;

b) heat-treating the substrate by using a heat source;

c) receiving, by a heat ray sensor provided outside the chamber and configured to convert radiation energy into electrical energy, infrared rays radiated from the substrate, which is heated through the heat treatment using the heat source, through an infrared ray transmission window provided in the chamber and transmitting an infrared ray having a wavelength of 8 μm or more;

d) outputting an electric signal according to a light reception result, from the heat ray sensor; and e) detecting, by a temperature detector which includes the heat ray sensor and the infrared ray transmission window, a temperature of the substrate, wherein the temperature detector is configured to detect the temperature of the substrate based on the electric signal output from the heat ray sensor such that influences of a temperature of the heat ray sensor and a temperature of the infrared ray transmission window are removed.

2. The substrate processing method of claim 1, wherein, in e), the temperature detector is further configured to detect the temperature of the substrate based on the electric signal output from the heat ray sensor such that an influence of a temperature of the heat source is further removed.

3. The substrate processing method of claim 2, wherein the heat ray sensor and the infrared ray transmission window are thermally coupled to each other such that the influence of the temperature of the infrared ray transmission window is replaced by the influence of the temperature of the heat ray sensor, and wherein in e), the temperature detector is further configured to detect the temperature of the substrate based on the electric signal output from the heat ray sensor such that the influence of the temperature of the heat ray sensor is removed.

4. The substrate processing method of claim 1, wherein the heat source is an LED light source provided outside the chamber, and wherein in b), the substrate is heated by being irradiated with LED light, which is emitted from the LED light source, through an LED transmission window provided in the chamber.

5. The substrate processing method of claim 4, wherein, in e), the temperature detector is further configured to detect the temperature of the substrate based on the electric signal output from the heat ray sensor such that an influence of a temperature of the LED transmission window is further removed.

6. The substrate processing method of claim 5, wherein the temperature of the substrate is detected in a state in which an operation of the LED light source is stopped.

7. The substrate processing method of claim 5, wherein the heat ray sensor and the infrared ray transmission window are thermally coupled to each other such that the influence of the temperature of the infrared ray transmission window is replaced by the influence of the temperature of the heat ray sensor, and wherein in step e), the temperature detector is further configured to detect the temperature of the substrate based on the electric signal output from the heat ray sensor such that the influence of the temperature of the heat ray sensor is removed.

8. The substrate processing method of claim 4, wherein the LED light source is divided into a plurality of zones, and wherein in e), the temperature of the substrate is measured for each of the plurality of zones.

9. The substrate processing method of claim 1, wherein the temperature of the substrate measured by using the heat ray sensor is room temperature or higher and 300 degrees C. or lower.

* * * * *